(12) United States Patent
De Bettignies et al.

(10) Patent No.: US 10,774,486 B2
(45) Date of Patent: Sep. 15, 2020

(54) LIGHT SIGNALLING SLAB AND SYSTEM CAPABLE OF USING SUCH A SLAB

(71) Applicants: COMMISSARIAT À L'ÉNERGIE ATOMIQUE ET AUX ÉNERGIES ALTERNATIVES, Paris (FR); COLAS, Boulogne-Billancourt (FR)

(72) Inventors: Rémi De Bettignies, Le Bourget du Lac (FR); Franck Barruel, Le Bourget du Lac (FR); Stéphane Guillerez, Lepin le Lac (FR); Eric Coquelle, Versailles (FR); Valérian Soulima, Chambery (FR); Nicolas Chaintreuil, Montmelian (FR); Jean Therme, Saint Jean d'Arvey (FR)

(73) Assignees: COMMISSARIAT A L'ENERGIE ATOMIQUE ET AUX ENERGIES ALTERNATIVES, Paris (FR); COLAS, Boulogne-Billancourt (FR)

( * ) Notice: Subject to any disclaimer, the term of this patent is extended or adjusted under 35 U.S.C. 154(b) by 0 days.

(21) Appl. No.: 16/486,285

(22) PCT Filed: Feb. 15, 2018

(86) PCT No.: PCT/FR2018/050368
§ 371 (c)(1),
(2) Date: Aug. 15, 2019

(87) PCT Pub. No.: WO2018/150144
PCT Pub. Date: Aug. 23, 2018

(65) Prior Publication Data
US 2020/0232173 A1    Jul. 23, 2020

(30) Foreign Application Priority Data

Feb. 17, 2017  (FR) ...................................... 17 51311
Oct. 2, 2017   (FR) ...................................... 17 59200

(51) Int. Cl.
*F21S 8/00*    (2006.01)
*E01F 9/559*   (2016.01)
(Continued)

(52) U.S. Cl.
CPC ................ *E01F 9/559* (2016.02); *E01C 5/22* (2013.01); *E01C 17/00* (2013.01); *E01F 9/582* (2016.02);
(Continued)

(58) Field of Classification Search
None
See application file for complete search history.

(56) References Cited

FOREIGN PATENT DOCUMENTS

| ES | 1076871 | 5/2012 |
|---|---|---|
| WO | WO 2016/016165 | 2/2016 |
| WO | WO 2016/016484 | 2/2016 |

*Primary Examiner* — Vip Patel
(74) *Attorney, Agent, or Firm* — Oblon, McClelland, Maier & Neustadt, L.L.P.

(57) ABSTRACT

The invention relates to a one-piece light signalling slab (2) comprising a structure with a plurality of layers that are superposed and attached together, said structure comprising:
A first transparent or translucent layer (200) forming a front face of said slab;
A light assembly (201) comprising a plurality of light emitting diodes (Ds) electrically connected together;
An assembly (202a, 202b) encapsulating said plurality of light emitting diodes;
A second layer (203) forming a rear face of said plate and being made up of a composite polymer/fibre-glass material;
Said encapsulating assembly being positioned between said first layer (200) and said second layer (203).

20 Claims, 6 Drawing Sheets

(51) Int. Cl.
    *E01C 17/00*     (2006.01)
    *F21V 23/06*     (2006.01)
    *G08G 1/095*     (2006.01)
    *E01F 9/582*     (2016.01)
    *G08G 1/005*     (2006.01)
    *E01C 5/22*     (2006.01)

(52) U.S. Cl.
    CPC .............. *F21V 23/06* (2013.01); *G08G 1/005* (2013.01); *G08G 1/095* (2013.01)

LIGHT SIGNALLING SLAB AND SYSTEM CAPABLE OF USING SUCH A SLAB

CROSS REFERENCE TO RELATED APPLICATIONS

This application is a National Stage of International Application No. PCT/FR2018/050368 filed on Feb. 15, 2018, which claims priority to French Application No. 1751311 filed on Feb. 17, 2017, and French Application No. 1759200, filed Oct. 2, 2017, the contents of which are hereby incorporated by reference in their entirety.

TECHNICAL FIELD OF THE INVENTION

The present invention relates to a luminous signaling slab.

The invention may be implemented in many applications that notably require elements that are thin, flexible and/or particularly robust in order to withstand shocks, substantial mechanical loads or to resist vandalism.

One preferred, but nonlimiting, application thereof is thus to zones that receive pedestrians, bicycles or any other type of vehicular traffic, for example highways, sidewalks, train station platforms, inter alia.

The invention also relates to a system able to use such a luminous slab.

The system will possibly be a crosswalk system. This system notably comprises photovoltaic zones and signaling zones equipped with lighting means powered by the electrical energy harvested by virtue of the photovoltaic zones. Nonlimitingly, the signaling zones will possibly be implemented using one or more of said luminous signaling slabs.

PRIOR ART

Many lighting solutions exist that propose luminous units for embedding in a housing formed in a wall or in a highway. This is for example the case of the solution described in patent application CN201382393U or in patent application EP2803911A1.

Patent application WO2016/016484A1 for its part proposes a solution that is integrated into the highway and that extends the white strips of a crosswalk, thus allowing signaling to be improved around the zone where pedestrians cross.

Many other solutions for producing signals or warnings using luminous units integrated into roads have been proposed.

However, most of the known solutions propose luminous units of large thickness. Although this large thickness may make the unit more robust and resistant to mechanical stresses, it may also make its installation more difficult, the latter often requiring infrastructure work to be done.

In addition, because of their size and their characteristics, these luminous units are limited to use as spotlights, and have neither the mechanical characteristics, nor the adherence characteristics required for use under traffic load, nor the ability to resist vandalism.

However, when a luminous signaling zone is integrated directly into the road in order to provide a warning of the presence of a danger zone, the luminous signaling architecture must have an unfailing reliability. This architecture must have the qualities of:

Reliability, in order to operate independently of meteorological or mechanical stresses;
Mechanical strength in order to resist any type of pedestrian, cyclist or motor-vehicle traffic load;
Flexibility in order to be easily positioned on a layer whether it is planar or not;
Adherence in order to recreate the roughness characteristics of a conventional crossable zone such as a highway;
Thinness in order notably to permit its flexibility, limit its heightwise bulk, and to allow it to be easily positionable on an existing highway without substantial modifications or work;
Visibility, in order to always be seen, whatever the weather conditions and in particular in case of fog or rain;

One aim of the invention is therefore to provide a luminous signaling slab forming at least some of a crossable zone and having the qualities described above.

SUMMARY OF THE INVENTION

This aim is achieved with a luminous signaling slab of integral construction having a structure made up of a plurality of superposed layers that are fastened to one another, said structure comprising:

A transparent or translucent first layer forming a front face of said slab;
A luminous assembly comprising a plurality of light-emitting diodes that are electrically connected to one another;
An encapsulating assembly encapsulating said plurality of light-emitting diodes;
A second layer forming a back face of said slab and composed of a polymer/glass-fiber composite;
Said encapsulating assembly being positioned between said first layer and said second layer.

According to one particularity, each tile of the first layer is positioned facing at least one light-emitting diode.

According to another particularity, the first layer is made from a polymer chosen from polycarbonate, polymethyl methacrylate, ethylene tetrafluoroethylene and polyvinylidene fluoride.

According to another particularity, the first layer has a thickness larger than 100 µm, advantageously comprised between 200 µm and 3200 µm and preferably between 400 µm and 750 µm.

According to another particularity, the second layer has a stiffness defined by a Young's modulus at room temperature higher than 1 GPa.

According to another particularity, said second layer has a thickness comprised between 0.3 mm and 3 mm.

According to another particularity, the light-emitting diodes are organized in a ribbon deposited on the second layer or on a carrier, or are connected to a printed circuit board.

According to another particularity, said second layer is produced in the form of a printed circuit board to which said light-emitting diodes are directly connected.

According to another particularity, the encapsulating assembly is made from a material having a Young's modulus at room temperature higher than 50 MPa.

According to another particularity, said encapsulating assembly has a thickness comprised between 100 µm and 4 mm and advantageously comprised between 250 µm and 1 mm.

According to another particularity, the multilayer structure comprises at least one intermediate layer, arranged between said first layer and the encapsulating assembly and configured to join said first layer to the encapsulating assembly by adhesive bonding.

According to another particularity, said intermediate layer is made from one or more materials chosen from a polyolefin, rubber, elastomer or epoxy.

According to another particularity, the intermediate layer is configured to have a Young's modulus at room temperature lower than or equal to 100 MPa.

According to another particularity, said intermediate layer has a thickness comprised between 200 μm and 1600 μm.

According to another particularity, said structure comprises an adhesive layer located on the back face, making contact with the second layer.

According to another particularity, said structure comprises a tread applied to said first layer, said tread being non-opaque and having a textured and irregular surface.

The invention also relates to a system comprising a crossable zone equipped with a base layer, said system comprising one or more luminous signaling slabs such as defined above, fastened to said base layer, each slab being positioned so as to form a marking on said crossable zone when the luminous assembly thereof is turned on.

As shown in FIG. 6, such a marking may form a crosswalk. A crosswalk is composed of a plurality of parallel white strips painted on the highway and placed at regular intervals over all the width of the highway to be crossed.

These crosswalks must be maintained regularly in order to remain visible to drivers of vehicles. Over time, it is however possible for the white strips of crosswalks to be damaged and to become increasingly less contrasted with the rest of the highway, making them less visible to drivers when exterior light levels are low or high.

In certain zones, notably in the vicinity of schools, in commercial areas or during events, the multiplication of the number of vehicles traveling may require extra safety measures to be taken to allow pedestrians to cross a highway safely. In the vicinity of schools, it is for example a question of employing dedicated personnel to assist children in crossing. However, it is not possible to provide personnel twenty-four hours a day and notably at night.

Signs, notably luminous signs, that allow vehicles to be warned of the proximity of a crosswalk do exist. However, their location upstream of crosswalks does not necessarily warn the vehicle that it is necessary to slow down. In addition, these signs often need to be supplied with electricity.

Moreover, patent application US2005/270175A1, patent application FR3020645A1 and patent application FR2790060A1 describe various signaling solutions, used in the context of crosswalk systems. However, these solutions are often simple devices that are added to conventional crosswalks. They are therefore not completely integrated into the highway infrastructure and thus clutter the zone formed by the crosswalk, running the risk of distracting drivers approaching the danger zone.

There is therefore also a need for a crosswalk system that:
Remains visible over the long term, in the particular in the case of low or high light levels, and even in the absence of regular maintenance;
Allows drivers to be warned visibly that a pedestrian is about to cross the crosswalk;
Is easy to install and not very bulky;
Does not clutter the infrastructure, in order not to distract drivers approaching the zone;
Is able to easily adapt to various types of constraints, notably constraints on site, light level, or to the public intended to cross, etc.

This need may be met via a crosswalk system, comprising a crossable zone intended to be positioned on a highway in order to form a crosswalk comprising a plurality of signaling strips, said system having the following particularities:
The crossable zone comprises a plurality of photovoltaic zones comprising photovoltaic cells intended to capture light energy in order to convert it into electrical energy;
The crossable zone comprises a plurality of signaling zones, of non-zero areas, at least two thereof being separated by a photovoltaic zone so as to form said plurality of signaling strips of the crosswalk, each signaling zone incorporating electrical lighting means;
A control system for controlling said electrical lighting means;
At least one storage unit for storing the electrical energy generated by each photovoltaic zone and connected to said electrical lighting means in order to supply them with electrical energy;
Presence-detecting means;
A control and processing unit comprising at least one input connected to said presence-detecting means and at least one output connected to said control system;
According to one particularity of this system:
Each photovoltaic zone is composed of at least one slab;
Each signaling zone is composed of at least one slab;
The slabs forming the photovoltaic zones and the signaling zones are positioned adjacently and contiguously in order to form a functional layer throughout said crossable zone.

Nonlimitingly, the crosswalk system may notably employ, for each of the signaling zones thereof, one or more luminous signaling slabs having the particular configuration defined above and forming the subject matter of the invention.

According to one other particularity, said at least one slab forming each photovoltaic zone and said at least one slab forming each signaling zone have identical thicknesses.

According to one other particularity, the electrical lighting means of a signaling zone comprise light-emitting diodes.

According to one other particularity, the light-emitting diodes are arranged to delineate the area of the strip to which they belong.

According to one other particularity, the light-emitting diodes are regularly distributed in order to illuminate all the signaling zone.

According to another particularity, the signaling zone has a multilayer structure.

According to another particularity, said multilayer structure comprises at least one transparent layer making it possible to let a light flux pass and a wrapping in which said light-emitting diodes are encapsulated.

According to another particularity, each photovoltaic zone has a multilayer structure.

According to another particularity, said multilayer structure comprises at least one transparent layer making it possible to let a light flux pass and an encapsulating assembly in which said photovoltaic cells are encapsulated.

According to one possible variant embodiment, the presence-detecting means comprise at least one infrared camera.

According to another possible variant embodiment, the presence-detecting means comprise at least one photoelectric cell.

According to another possible variant embodiment, the presence-detecting means comprise at least one inductive sensor.

According to another possible variant embodiment, the presence-detecting means comprise at least one piezoelectric sensor positioned under at least one signaling zone or integrated into said signaling zone.

Certain variant embodiments of the detecting means will possibly advantageously be combined together in order to improve the effectiveness of the system.

According to one particularity, the system comprises a manual control member connected to one input of the control and processing unit.

Advantageously, the system comprises means for detecting the arrival of a vehicle in proximity to the crossable zone, which means are connected to at least one input of the control and processing unit.

Advantageously, the system comprises a light sensor connected to one input of the control and processing unit and the control and processing unit comprises a module for determining the light intensity of each signaling zone depending on data received from the light sensor.

According to another particularity, the system comprises a command sequence executed by the control and processing unit depending on data received on each input and arranged to determine control signals intended for the control system.

The command sequence may be implemented in a plurality of different ways, which may be used alone or in combination:
- the command sequence is arranged to command the turn on of the signaling zones simultaneously;
- the command sequence is arranged to command the turn on of the signaling zones sequentially, one signaling zone after another;
- the command sequence is arranged to command the turn on of the signaling zones sequentially, one signaling zone after another, after detection of a presence by said detecting means;
- the command sequence is arranged to command the turn on of each signaling zone instantaneously or gradually;
- the command sequence is arranged to command a turn on of the signaling zones gradually in one or more colors taking account of information related to the direction of arrival of a vehicle and/or the speed of a vehicle.

BRIEF DESCRIPTION OF THE FIGURES

Other features and advantages will become apparent in the following detailed description that is provided with reference to the appended drawings, in which.

DETAILED DESCRIPTION OF AT LEAST ONE EMBODIMENT

Figure 1:
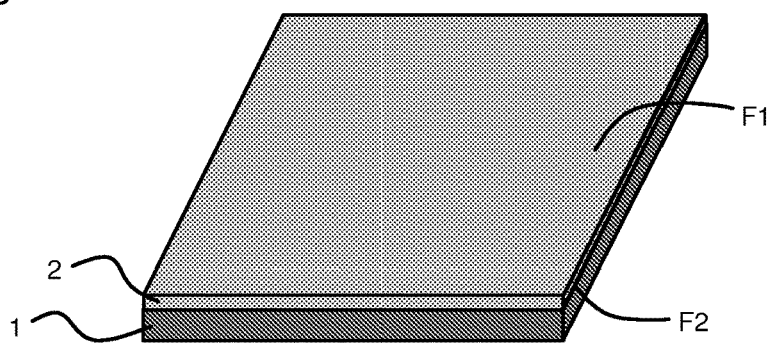
FIG. 1 shows a perspective view of a luminous signaling slab according to the invention.

In the rest of the description, nonlimitingly, by "crossable zone", what is meant is any zone provided to be walked over by pedestrians and/or cycled over by bicycles, and/or driven over by vehicles, such as for example a road or freeway, cycle track or sidewalk or a platform or a parking lot.

The invention relates to a luminous signaling slab (i.e. what could also be called a lighting slab 2). It is for example intended to form all or some of a crossable zone. The formed crossable zone will possibly comprise one or more luminous signaling slabs suitably positioned to define at least one luminous marking in the crossable zone when their luminous assemblies are activated. The slabs 2 will possibly be positioned contiguously or be separated from one another, depending on the marking or the lighting element to be produced.

In the rest of the description, the terms "front", "back", "upper", "lower", "top", "bottom" or other equivalent terms are to be considered with respect to an axis (A) that will be defined as perpendicular to the plane formed by a slab (vertical axis in the plane of the paper in the appended figures).

The luminous signaling slab 2 may be positioned so as to at least partially cover the surface of a base layer 1, this base layer 1 possibly for example being the existing highway or a lower layer thereof, after removal of the road surface. This base layer 1 is for example composed of a base course. Of course, since this base layer 1 does not form part of the luminous signaling slab, any other multilayer or monolayer structure may be envisioned. This base layer 1 may form part of the complete piece of infrastructure that will be described below.

The invention notably aims to produce a functional luminous signaling or lighting layer using one or more luminous signaling slabs suitably positioned to at least partially cover the upper face 10 of the base layer 1.

With reference to FIG. 1, a luminous signaling slab 2 of the invention comprises the features described below.

The slab 2 of the invention takes the form of an element of integral construction, i.e. an element that forms a single part. It advantageously has a first face, called the upper face F1, which is intended to form its external face, and a lower face F2 opposite and preferably parallel to the upper face. Between its two faces, the slab comprises a plurality of layers. The slab 2 may have an outline of any possible shape depending on its application. The slab may notably be of rectangular or square shape, and for example of dimensions equal to 20 cm×20 cm. Of course, depending on the type of signaling to be performed, it may have other dimensions. By way of example and nonlimitingly, it may be of 0.1 m×1.5 m or 0.1 m×3 m in an application to a discontinuous line on a highway, or 0.5 m×1.2 m or 0.5 m×2.4 m in the case of an application to a crosswalk.

Figure 2A:
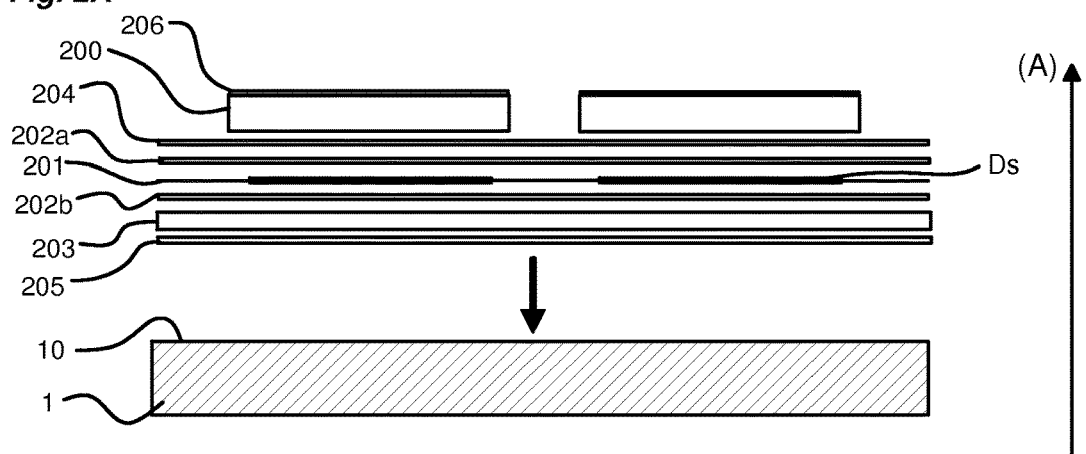
FIGS. 2A and 2B illustrate, via a cross-sectional view, the multilayer structure of the luminous signaling slab of the invention, according to two possible variant embodiments.
Figure 2B:
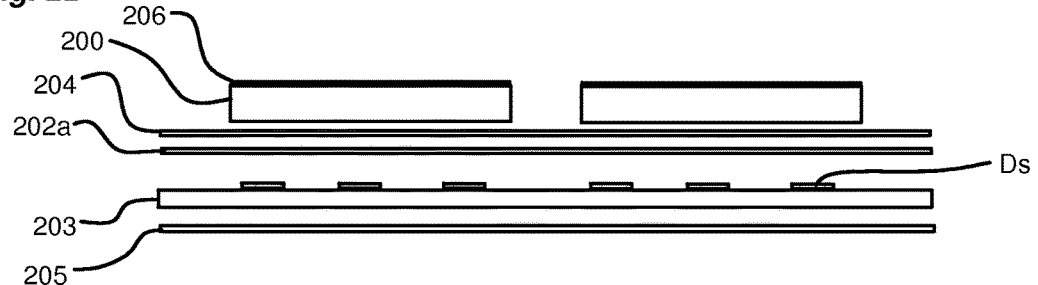

With reference to FIGS. 2A and 2B, from front to back, each luminous signaling slab 2 may comprise a multilayer structure such as described below. Certain layers described below may be optional.

"Front" First Layer

The first layer 200 comprises one or more juxtaposed transparent films or tiles. Production in a plurality of juxtaposed films or tiles makes it possible to manage the stresses due to thermal expansion during the use of the slab outside. Since the expansion is proportional to the dimensions of this first layer, using tiles of suitable dimensions makes it possible to accommodate thermal stresses and to avoid the appearance of effects such as delamination or deformation.

The first layer 200 is made from a transparent or translucent material so as to let a light flux pass.

By the term "transparent", what is meant is that the material forming the first layer is at least partially transparent to visible light, for example letting pass at least 80% of visible light.

By the term "translucent", what is meant is that the material forming the first layer allows diffuse transmission of visible light.

Moreover, the first layer may be tinted any color, depending on the targeted application.

The first layer 200 may be made from a polymer chosen from polycarbonate (PC), polymethyl methacrylate (PMMA), ethylene tetrafluoroethylene (ETFE) and polyvinylidene fluoride (PVDF). Advantageously, it is a question of polycarbonate.

The first layer 20 may have a thickness larger than 100 μm and advantageously comprised between 200 μm and 3200 μm and preferably between 400 μm and 750 μm.

Nonlimitingly, the first layer 200 is composed of a film of polished polycarbonate, treated against ultraviolet rays and of a thickness of 450 μm.

Each tile of the first layer 200 may be positioned facing one or more light-emitting diodes Ds of the luminous assembly described below.

Luminous Assembly

The luminous assembly 201 is composed of a plurality of light-emitting diodes Ds that are connected in series and/or parallel.

The light-emitting diodes Ds may emit in different colors.

Converting means may be employed in order to emit in a desired hue.

A given luminous signaling slab 2 may emit light signals of a plurality of colors (either by employing light-emitting diodes with the desired colors or suitable converting means).

Depending on the desired light density, the light-emitting diodes Ds may be spaced apart by a distance ranging from 0.5 cm to 30 cm and preferably by a distance comprised between 0.6 cm and 15 cm.

The light-emitting diodes Ds may be joined into ribbons that are deposited on a carrier or connected to a carrier (printed circuit board) allowing the diodes to be powered and for example comprising conductive ribbons on epoxy or Kapton, to which ribbons the light-emitting diodes Ds are connected.

In a given ribbon, the diodes Ds may be spaced apart by a pitch comprised between 0.5 cm and 10 cm and preferably comprised between 1 cm and 3 cm. The inter-ribbon distance may be comprised between 1 cm and 30 cm and preferably comprised between 2 cm and 15 cm.

This carrier of the light-emitting diodes may complete the "back" second layer 203 described below or replace this layer.

The carrier may have a thickness comprised between 0.1 mm and 5 mm, advantageously comprised between 0.1 mm and 2 mm, and ideally comprised between 0.15 mm and 1.5 mm.

Control means for controlling the light emission of the diodes Ds, which means are located in the slab and/or centralized in an external cabinet, are of course provided in order to control the luminous assembly 201 in a way suitable for the signaling to be performed. These control means may comprise a programmable logic controller comprising inputs/outputs. The controller may receive information coming from various sensors on its inputs and suitably control the luminous signaling slabs connected to its outputs.

Advantageously, the spacing between two neighboring tiles of the first layer 200 is smaller than or equal to the spacing between two neighboring light-emitting diodes Ds. Thus, at least each tile of the first layer 200 is placed facing at least one light-emitting diode.

Encapsulating Assembling

The structure comprises an encapsulating assembly or wrapping in which the luminous assembly that comprises the light-emitting diodes Ds is encapsulated.

By the employed term "encapsulating" or "encapsulated", what must be understood is that the light-emitting diodes Ds are housed in a preferably hermetic volume.

It allows the space present between the light-emitting diodes Ds of the luminous assembly 201 to be filled.

The encapsulating assembly may comprise an upper portion 202a and optionally a lower portion 202b.

The upper portion 202a is positioned between the first layer 200 and the luminous assembly 201.

The upper portion 202a forms a shell-like mechanical protection on the luminous assembly.

The upper portion 202a may have a stiffness level expressed by a Young's modulus at room temperature higher than 50 MPa.

Advantageously, the upper portion 202a of the encapsulating assembly is made from an ionomer having a Young's modulus higher than 300 MPa.

In one particular embodiment, the lower portion 202b of the encapsulating assembly is located between the luminous assembly 201 and the second layer 203 described below.

The lower portion 202b forms a mechanical protection and a barrier to water or moisture liable to rise from below the slab.

The lower portion 202b may have a stiffness level expressed by a Young's modulus at room temperature higher than 50 MPa.

Advantageously, the lower portion 202a of the encapsulating assembly is made from an ionomer having a Young's modulus higher than 300 MPa.

Each element produced in film form intended to form the upper portion and optionally the lower portion of the encapsulating assembly may have a thickness comprised between 0.1 mm and 2 mm, and ideally comprised between 0.3 mm and 1.5 mm.

Considered as a whole (one or two layers), said encapsulating assembly may have a thickness comprised between 100 μm and 4 mm and advantageously comprised between 250 μm and 1 mm.

"Back" Second Layer

The second layer 203 forms the lower layer of the structure and is the carrier of the luminous signaling slab 2.

This second layer 203 is made from a material intended to provide mechanical protection against crushing of the electronic circuits of the luminous assembly 201 from behind when the luminous signaling slab 2 is subjected to a substantial mechanical load.

The second layer 203 may have a stiffness expressed by a Young's modulus at room temperature higher than 1 GPa, advantageously higher than or equal to 3 GPa, and ideally higher than 10 GPa.

The second layer 203 is however sufficiently flexible to accommodate deformations of the base layer 1 of the highway.

The second layer is sufficiently flexible to conform to deformations in the highway (embossments or recesses of 1 cm every 20 cm, advantageously embossments or recesses of 0.5 cm every 20 cm, ideally embossments or recesses of 0.2 cm every 20 cm).

The second layer 203 may be made from a transparent or opaque and optionally tinted material, for example a material tinted in its bulk or the surface of which is tinted notably to define a pattern.

The second layer 203 may have a thickness comprised between 0.1 mm and 10 mm, advantageously comprised between 0.4 mm and 5 mm, and advantageously comprised between 1 mm and 3 mm.

The second layer 203 may be made from a polymer, for example from a polymer/glass-fiber composite or from a thermoset, such as a phenol-formaldehyde resin.

Nonlimitingly, the second layer 203 may for example be composed of a polymer/glass-fiber composites such as a fabric based on polyethylene terephthalate, propylene or polyepoxide and glass fibers with a glass-fiber content for example comprised between 20% and 70% by weight.

This second layer 203 may have a thermal expansion coefficient lower than or equal to 20 ppm, and preferably lower than or equal to 10 ppm.

According to a variant embodiment, this second layer 203 may be produced in the form of a printed circuit board to which the light-emitting diodes Ds are directly connected. This back layer therefore plays the role of carrier for the light-emitting diodes and protects them from the back side. Only the upper layer of the encapsulating assembly will then possibly be necessary. FIG. 2B illustrates such an architecture, in which the back layer 203 directly plays the role of carrier of the light-emitting diodes. The back layer 203 may then be a printed circuit board. The protective layer 202a is present in order to protect the light-emitting diodes from the front side and the back layer 203 protects them from the back side. The other layers of the structure are for example identical.

Protective and Compatibility Layers.

The structure may comprise one or more protective and compatibility layers, which layers are called intermediate layers.

In one embodiment, the structure may comprise a first intermediate layer 204 positioned between the first layer 200 and the upper portion 202a of the encapsulating assembly.

The structure may also comprise a second intermediate layer (not shown) positioned between the second layer 203 and the lower portion 202b of the encapsulating assembly.

Each of these intermediate layers may be necessary in case of chemical incompatibility between the first layer and the second layer and the encapsulating material.

Each intermediate layer may be made from a standard encapsulating material chosen for example from a rubber or elastomer such as ethylene vinyl acetate (EVA), a polyolefin, silicone, a thermoplastic polyurethane and polyvinyl butyral. It may also be made from a hot- or cold-cure (one- or two-component) liquid resin such as an acrylic, silicone or polyurethane resin.

Nonlimitingly and by way of example:
For the first intermediate layer, it may be a question of the association of one or more EVA films having a total thickness comprised between 200 μm and 1600 μm;
For the second intermediate layer, it may be a question of one or more films made of TPU having a total thickness comprised between 200 μm and 1500 μm;

The first intermediate layer 204 may have deformability properties with a view to giving the slab a certain damping coefficient. In this case, this layer will have a dual compatibility and damping function. It will also allow the space between the light-emitting diodes Ds to be filled.

Each intermediate layer may have a stiffness defined by a Young's modulus at room temperature lower than or equal to 100 MPa.

Each intermediate layer may have a thickness comprised between 0.01 mm and 1 mm.

Adhesive Layer of the Slab

The structure may comprise an adhesive layer 205 located on the back side of the slab and making contact with the second layer 203 and allowing the slab to be adhesively bonded to the surface 10 of the base layer 1. This adhesive layer may be formed from an adhesive or from an adhesive polymer, for example a double-sided adhesive or adhesive polymer.

This adhesive may be an adhesive allowing the slab to adhere to the base layer 1. This adhesive may be based on an MMA (methyl methacrylate) resin that optionally contains fillers, or may be an asphalt, this adhesive being applied in doses ranging from 0.5 to 10 kg/m$^2$.

The use of an adhesive associated with the composite second layer 203 may allow the back face of the slab to be strengthened and the risk of crushing of the light-emitting diodes Ds when they are subjected to substantial mechanical loads to be avoided.

Tread

The tread may cover one or more luminous signaling slabs. For a single slab, the tread may cover all the tiles of the first layer continuously or cover each tile independently, forming discontinuities on the slab 2.

For each slab, the tread 206 covers the first layer 200 in order to give the slab 2 a certain roughness and adherence properties.

The tread 206 may be composed of a transparent or translucent resin and of irregular texturing elements allowing the slab to have a certain adherence, even under wet conditions.

The resin may be an acrylic, epoxy or polyurethane resin. The resin may be deposited with a dose comprised between 10 and 1000 g/m$^2$, advantageously comprised between 30 and 700 g/m$^2$, and advantageously comprised between 150 and 600 g/m$^2$.

The tread optionally contains a colored substance (for example a white or yellow highway paint, or even $TiO_2$ pigments, or a yellow paint), to which transparent or colored texturing elements, for example crushed glass, of a size comprised between 0.01 and 4 mm, better still comprised between 0.1 and 2 mm, and ideally comprised between 0.2 and 1.8 mm, are added. The dose of this crushed glass is comprised between 10 and 800 g/m$^2$, better still 30 and 500 g/m$^2$, and ideally 50 and 400 g/m$^2$. The color may be measured according to either of standards NF EN 1871 and NF EN 1436, and fall within the chromatic perimeter of a marking, for example standard NF EN 1436+A1 for a white highway marking. The resins employed must be transparent or translucent, and adhere well both to the first layer of the slabs and to the texturing elements.

The coating may have a degree of transparency making it possible to let pass at least 10% of the light flux generated by the luminous assembly 201, and advantageously 50% to 95% of the light flux generated by the luminous assembly 201.

Taking account of the various layers described above, advantageously, a luminous signaling slab 2 may have the following multilayer structure, from the front of the slab to its back:

A first layer 200 formed from a film of 450 μm thickness, made from polished and anti-UV-treated polycarbonate;

A damping layer 204 formed from one or more EVA films having a thickness chosen to be between 200 and 1600 μm and from one or more thermoplastic films made of TPU and of a thickness comprised between 200 μm and 1500 μm;

An encapsulating upper layer 202a formed from an ionomer having a stiffness defined by a Young's modulus higher than 300 MPa and chosen to have a thickness comprised between 100 μm and 500 μm;

A luminous assembly 201 composed of light-emitting diodes Ds joined into ribbons or to a printed circuit board, with an inter-diode spacing able to range from 0.5 to 30 cm;

A second layer 203 formed at the back and composed of a composite polymer, namely a fabric based on polyethylene terephthalate, polypropylene or polyepoxide and glass fibers with a glass-fiber content for example comprised between 20 and 70% by weight and preferably between 50% and 70% by weight, having a thickness of 1.5 mm and a Young's modulus equal to 12 GPa. As already noted above, this second layer 203 may take the form of a printed circuit board and directly play the role of carrier for the light-emitting diodes Ds.

Figure 3A:
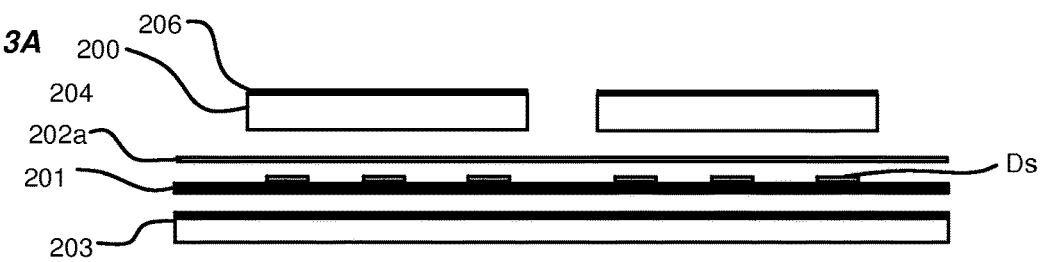
FIGS. 3A and 3B show two possible embodiments of the luminous signaling slab of the invention.

A tread 206 such as described above;

According to one particular aspect of the invention, each slab 2 may, depending on its state, have a distinct color. Thus, nonlimitingly, with reference to FIGS. 3A and 3B, the following configurations are achieved:

When its luminous assembly 201 is turned off, its color may be dark, i.e. of color close to that of the rest of the highway. In this case, the back second layer 203 and/or the carrier of the luminous assembly may be colored this dark color (it may in particular directly be a question of the printed circuit board to which the light-emitting diodes are connected). When the slab is turned off, nothing allows it to be distinguished from the rest of the highway (FIG. 3A). It is thus a question of coloring the "back" second layer 203 a suitable color. It will be possible to deposit paint thereon (for example a black Griffon paint in a thickness comprised between 0.001 and 1 mm), or to achieve this end by inserting a colored polymer film (for example a black EVA film), or by pigmenting, for example with carbon black, either solely the top portions of the layer or it completely in its bulk. The latter embodiment is particularly suitable for "back" layers made up of a plurality of plies: only the upper plies are pigmented, in order to impact little the cost or the mechanical properties.

Figure 3B:
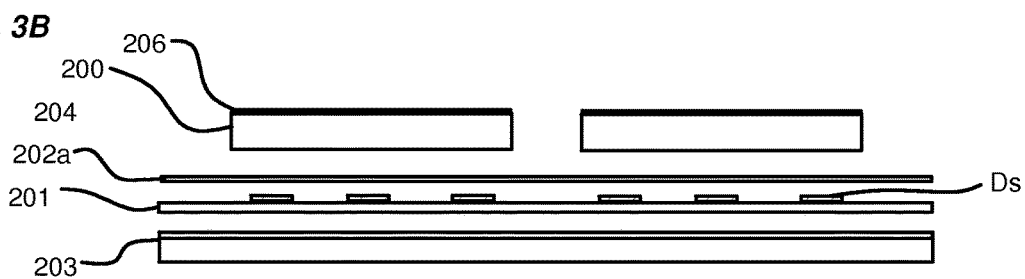

When its luminous assembly 201 is turned off, its color may be light, for example white or yellow. Turning on its luminous assembly then makes it possible to make it even more visible. In this case, the back second layer 203 and/or the carrier of the luminous assembly may be colored in this white or yellow color (for example using a white Griffon or PU-based paint in a thickness comprised between 0.001 and 1 mm). When the slab is turned off, the marking remains visible. This solution allows the marking to remain visible, even in the case of malfunction of the slab (FIG. 3B). It is also possible to insert a translucent film or a white woven made of PET above the luminous assembly 201 and/or to add pigments (for example $TiO_2$) or paint to the resin from which the tread is made (for example addition to an acrylic Verniroc resin of between 0.5 and 50% white Griffon paint, and better still of between 1 and 30% and ideally of between 1 and 20%).

Of course, depending on the targeted applications, any other color may be envisioned, whether this be in the active or inactive state of the luminous signaling slab.

According to another aspect of the invention, the light-emitting diodes may illuminate in a plurality of distinct colors in order to produce dynamic notifications on a highway. Nonlimitingly, it may be a question of speed-limit indications (which are for example modified depending on weather conditions), indications of parking spaces for deliveries (red at certain times of day and green the rest of the time), indications of chevron or zigzag type for bus stops (change of color depending on the time that it should be expected to wait) or any other marking.

Figure 4:
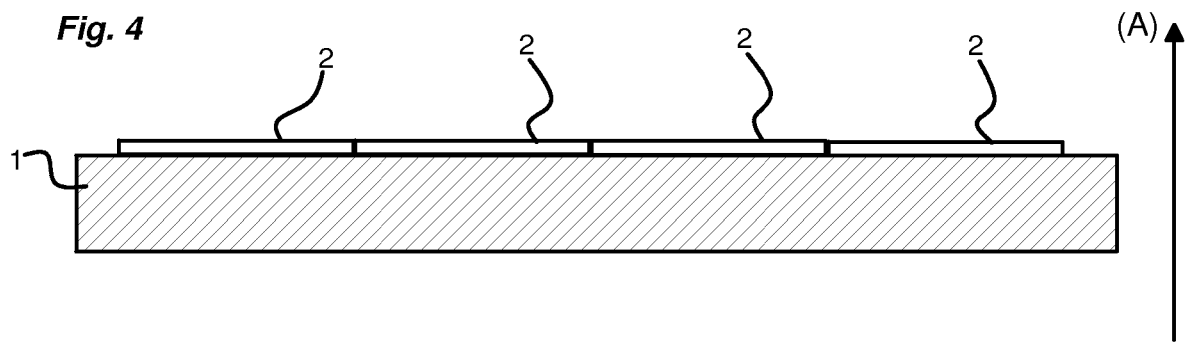
FIG. 4 illustrates, via a cross-sectional view, an example of an arrangement of luminous signaling slabs on a highway.
Figure 5A:
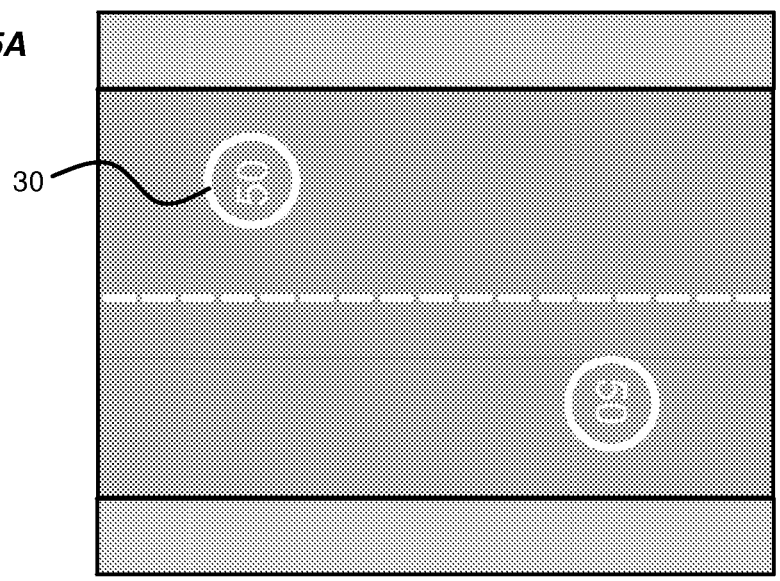
FIGS. 5A and 5B show two examples of implementation of the luminous signaling slabs according to the invention.
Figure 5B:
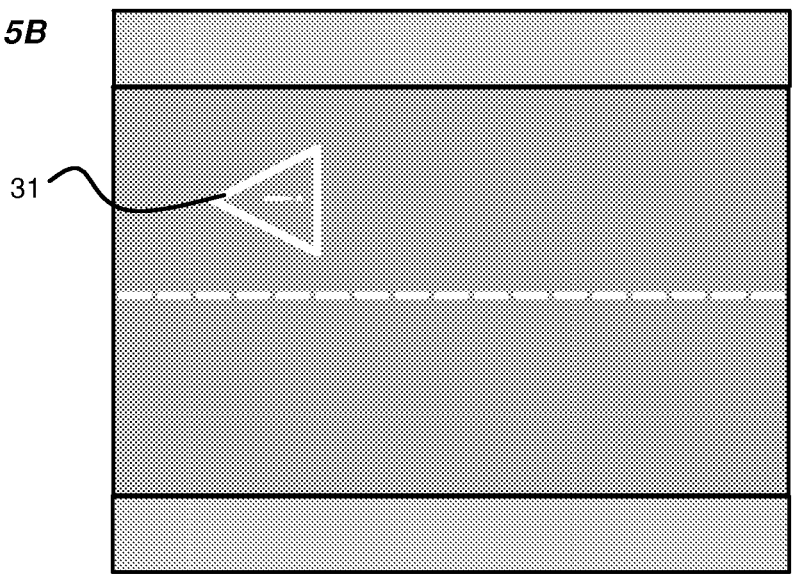

According to one other aspect of the invention, as shown in FIG. 4, one or more luminous signaling slabs 2 such as described above may be positioned on the surface 10 of a base layer 1 in order to form a crossable zone. Said slabs may form any type of marking or message conventionally present in a crossable zone, in particular:

Marking forming a continuous or discontinuous line on a road;

Pedestrian crossing;

Chevrons delineating a stopping place, for example for taxis or buses;

Edge marking signaling a dangerous zone;

Speed indication on the highway;

Marking for signaling the need to slow down, a danger;

Guiding marking;

Precise indication of the time to expect the next bus or of the time that it should be expected to wait;

Indications of an informational, cultural or marketing nature;

FIGS. 5A and 5B illustrate a few examples of markings that it is possible to produce using one or more luminous signaling slabs according to the invention. In FIG. 5A, the luminous marking 30 consists of an indication of a speed limit to be respected, indicating that this lane may be driven on at the indicated speed. In FIG. 5B, the luminous marking 31 consists of an indication of a danger.

One or more luminous signaling slabs will possibly be controlled sequentially in order to create a chaser effect or a variable-brightness effect.

The luminous signaling slab 2 thus has a certain number of advantages, among which:

A very small thickness, able to be smaller than 10 mm;

A high mechanical strength in order to withstand any mechanical load, in particular the passage of automobiles or trucks;

A high degree of flexibility, allowing it to accommodate imperfections in the surface of the base layer 1;

A high lighting level, making it possible to ensure effective signaling in any situation;

An enhanced resistance to bad weather by virtue of a suitable encapsulation of the electronic circuits;

By virtue of its small thickness, an installation that is facilitated, even on an existing highway;

The luminous signaling slab has been described above for a system comprising a crossable zone with a base layer 1. However, the invention may be implemented in many other applications, notably any application that requires elements that are thin, flexible and/or robust with respect to shocks, mechanical loads or indeed needs to resist vandalism.

Nonlimitingly, a crosswalk system may employ one or more of said luminous signaling slabs described above.

Figure 6:
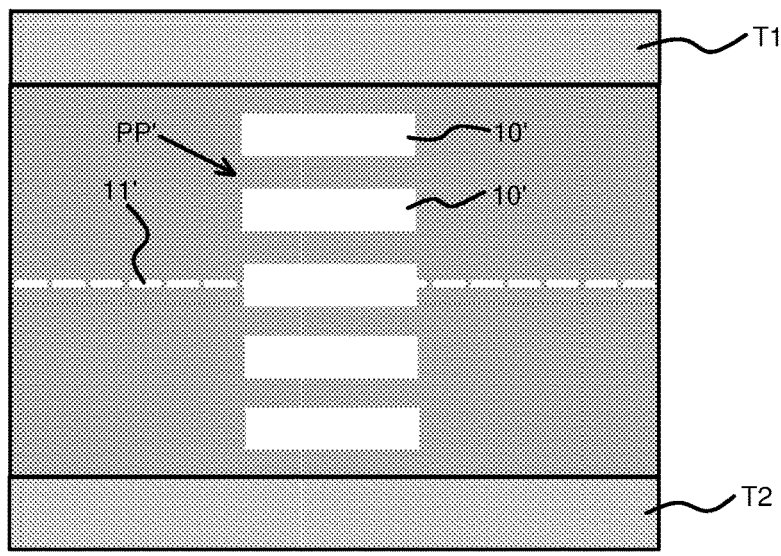
FIG. 6 shows a top view of a conventional crosswalk.

FIG. 6 shows a conventional crosswalk PP'. It typically comprises a plurality of identical white strips 10' of regulated dimensions and that are spaced apart from one another by a set distance. They are arranged parallel to one another and their longitudinal direction is oriented in the direction of vehicular traffic on the highway 12'. They are distributed over the entire width of the highway from one sidewalk T1 to the other T2 (if of course sidewalks are present). A white line 11' (dashed in FIG. 6) allows the two lanes of the highway and the two directions of vehicular traffic to be delineated.

An improved crosswalk system (shown in the appended figures) notably has two main aspects. It is provided with lighting means, allowing it to remain visible, even in the case of high or low light levels and it is self-sufficient in terms of electrical energy, i.e. there is no need to connect its lighting means to the electrical grid since it is self-powered. Advantageously, any surplus generated electricity will possibly be fed into the electrical grid R. The system then comprises specific means for ensuring a transfer of the generated electrical energy to the electrical grid R, for example but not solely when the storage unit belonging to the system is full. It will for example also be a question of being able to employ the photovoltaic zones ZP to feed electrical energy into the grid R when the latter requires additional capacity, whether the electric storage unit is full or not.

Such a crosswalk system 1 notably comprises a defined crossable zone over which vehicles may drive and on which pedestrians may cross. This crossable zone is composed of a functional layer advantageously made up of a plurality of portions, which layer is deposited on a lower layer, typically a base course or directly on the road surface (an asphalt) of the highway. In the first case, it will possibly be necessary to form a cutout with the dimensions of the crossable zone. In the second case, since the functional layer is of very small thickness, for example of thickness smaller than 10 mm, it places no constraints on the movements of vehicles or pedestrians.

The functional layer differs from a standard road surface deposited on the base course in that it allows the highway to be functionalized and provides it with interacting means, notably visual interacting means, that are controlled based on information received by defined detecting means, which are described below.

Figure 7:
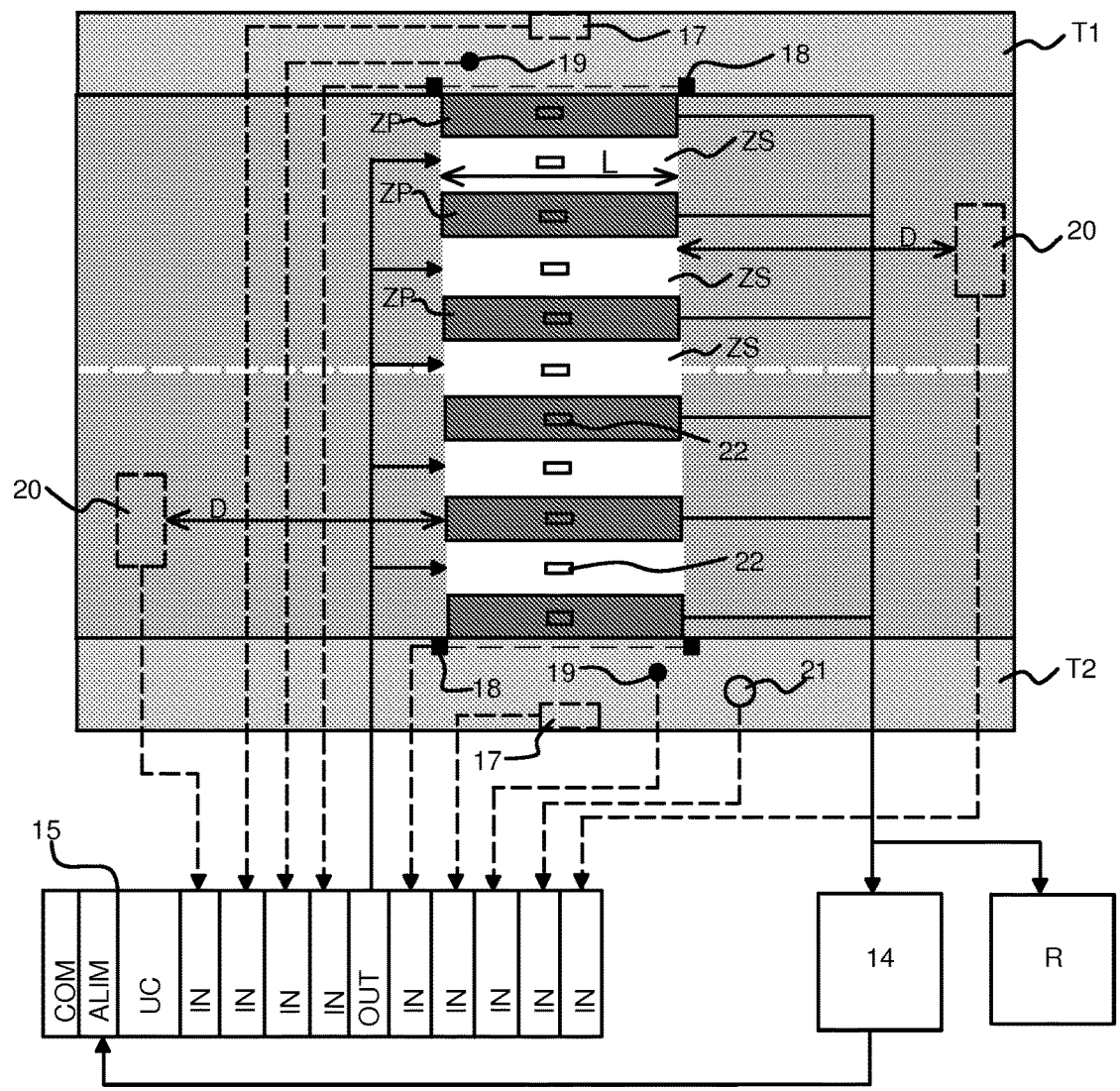
FIG. 7 schematically shows an improved crosswalk system.

According to one aspect of the invention, the crossable zone of the crosswalk system of the invention advantageously consists solely of:

Photovoltaic zones ZP;

Signaling zones ZS;

With reference to FIG. 7, the photovoltaic zones ZP and the signaling zones ZS are advantageously placed beside one another in order to form the entirety of the crossable zone and to form a crosswalk having the same visual appearance as a conventional crosswalk (such as shown in FIG. 6). The signaling zone ZS are therefore preferably produced in the form of rectangular strips of regulated dimensions (width of 0.50 m, length L comprised between 2.5 m and 6 meters) that are spaced apart from one another by darker rectangular strips of a normalized spacing (comprised between 0.50 m and 0.80 m), forming the photovoltaic zones ZP. The aforementioned dimensions are given by way of example and of course may change depending on the laws in force.

The crossable zone thus formed is positioned in the continuity of the conventional highway, with no transition. Its particularly small thickness allows it in any case to be at a similar level to that of the road surface of the highway located upstream and downstream. Of course, since certain crossways are elevated, it would be possible to suitably raise it with respect to the level of the road surface of the highway located upstream and downstream.

According to one particular aspect of the system, each photovoltaic zone ZP will for example be formed from one or more slabs of identical dimensions positioned adjacently and contiguously in order to cover all the photovoltaic zone. Likewise, each signaling zone ZS will possibly be formed from one or more slabs of identical dimensions positioned adjacently and contiguously in order to cover all the signaling zone.

The slabs of the signaling zones and the slabs of the photovoltaic zones are advantageously positioned adjacently and contiguously in order to form the entirety of the area of the functional layer of the system of the invention.

The photovoltaic slabs and the luminous slabs of the signaling zones are advantageously of an identical thickness in order to allow easy installation of the crossable zone.

According to one particular aspect of the system, the dark strips that separate the signaling zones are therefore advantageously formed by the photovoltaic zones ZP. These dark strips are advantageously of a length L identical to that used for the strips of the signaling zones and have a width that is for example larger than those of the strips of the signaling zones, for example ranging from 0.70 m to 1 m. Of course, the photovoltaic zones ZP could be positioned on other portions of the highway. However, it is particularly advantageous to group the photovoltaic zones and the signaling zones together in a defined perimeter, in order to create a single functional layer within this perimeter. By way of example, each photovoltaic zone having dimensions of 2.8 m×0.7 m has a power of 240 W peak.

With reference to FIG. 7, there is therefore an alternation between the photovoltaic zones ZP and the signaling zones ZS. Depending on the width of the highway (between the two sidewalks T1 and T2), there will thus be a plurality of signaling zones ZS and a plurality of photovoltaic zones ZP placed in alternation, advantageously over all the width of the highway. Advantageously, each photovoltaic zone ZP or the slabs that compose it and each signaling zone or the slabs that compose it, are produced in the form of elements of integral construction that it is possible to place directly on the base course. Only the electrical connections are then to be made to the various units of the system.

According to one particularly advantageous aspect of the system, the photovoltaic zones are dimensioned in a such a way as to make them suitable for powering all the signaling zones. Each photovoltaic zone will for example be dimensioned to ensure it is able to power at least one signaling zone. In this way, whatever the width of the highway, it will be possible to be sure that all the signaling zones will be able to be supplied with sufficient electrical energy. An example of possible dimensions will notably be described below with reference to FIG. 12.

According to another advantageous aspect of the system, the electrical cabling will also be facilitated because the photovoltaic zones in the signaling zones will be able to be arranged to share the same cable runs.

Figure 8:
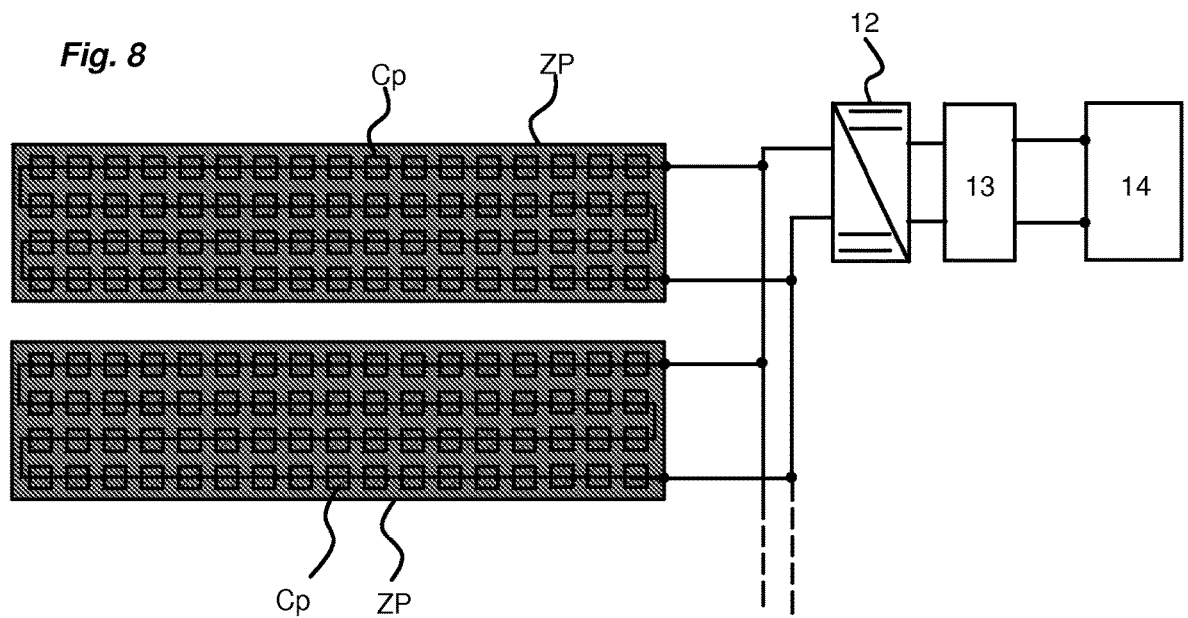
FIG. 8 schematically shows the photovoltaic zones of the optimized crosswalk system of FIG. 7 and the electrical architecture employed to store the generated electrical energy.

More precisely, the photovoltaic zones ZP each comprise photovoltaic cells intended to convert light energy into electrical energy. The photovoltaic cells Cp are connected to one another using a conventional topology such as found in a photovoltaic module. By way of nonlimiting example, with reference to FIG. 8, the photovoltaic architecture that includes the photovoltaic zones has the following particularities:

Each photovoltaic zone ZP comprises a plurality of rows of photovoltaic cells Cp, which are connected in series and/or in parallel;

A converter 12 (here a DC/DC converter) is advantageously connected to all of the photovoltaic zones ZP in order to ensure an electrical conversion to an electrical energy storage unit 14 through a battery charger 13;

Control means, optionally integrated into the converter, are able to control the converter so as to perform the voltage conversion;

Each photovoltaic zone advantageously includes what are called bypass diodes (not shown), each for bypassing a row of separate cells of a zone if a cell in this row were to be faulty;

The converter 12 will possibly be housed in a cavity produced in the highway and closed by a trapdoor or in an electrical cabinet positioned in proximity to the produced functional layer.

According to one particular aspect, the crosswalk system also comprises an electrical energy storage unit 14, intended to store the electrical energy generated by the photovoltaic cells of the photovoltaic zones. This electrical energy storage unit 14 for example comprises one or more batteries. The battery charger 13 and the converter 12 that were described above are controlled in order to ensure the charge of the electrical energy storage unit 14 with the electrical energy generated by the photovoltaic zones ZP. The electrical energy stored in this electrical energy storage unit 14 will be employed to power:

The lighting means of the signaling zone ZS, i.e. the light-emitting diodes;

A control and processing unit 15, via a power module ALIM;

Various detecting means mentioned below, unless the latter are self-powered;

Optionally the control unit of the converter 12 if it is present;

Any other detection solution or sensor requiring an electrical power supply;

Advantageously, for example when the storage unit 14 is full, any surplus electricity generated by the photovoltaic zones ZP will possibly be transferred to the electrical grid R, the latter then becoming an extension of the storage unit 14. However, the transfer of electricity to the grid R will possibly be carried out at any moment, notably in the case where additional capacity is required by the electrical grid. The photovoltaic zones ZP will then possibly also be employed to this end. Likewise, in the case where the grid R requires additional capacity, it will be possible to act so as to discharge the electrical energy storage unit of the system. The system will therefore be able to function in a setup of "Smart Grid" type.

Figure 9:
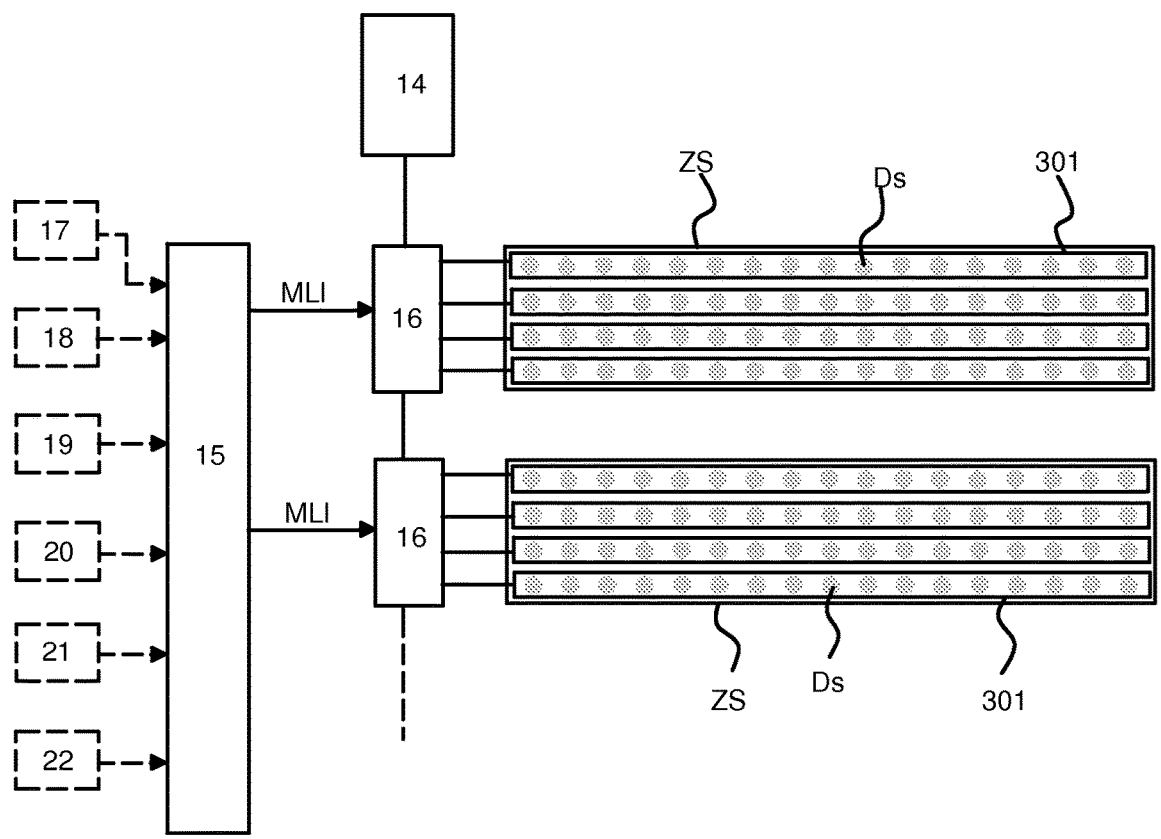
FIG. 9 schematically shows the signaling zones of the improved crosswalk system of FIG. 7 and the control architecture employed.
Figure 10:
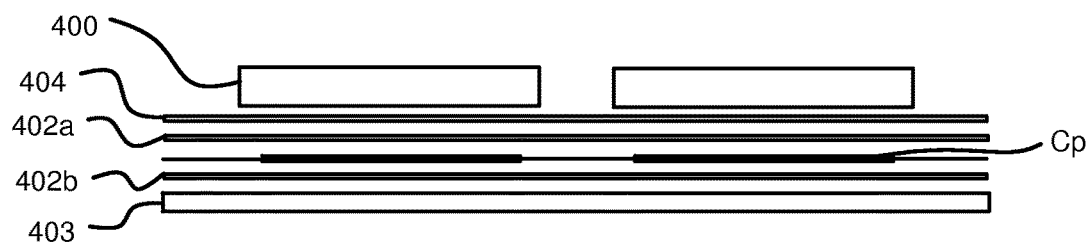
FIG. 10 schematically shows an example of a multilayer structure of a photovoltaic zone employed in the improved crosswalk system of FIG. 7.

Nonlimitingly, each photovoltaic zone ZP has a structure such as that described in the two patent applications Nos WO2016/16165A1 and WO2016/16170A1 and shown in FIG. 9. This structure of the photovoltaic zone will advantageously be semi-rigid, i.e. have a degree of flexural deformability able to range up to 30% with respect to the initial shape.

Without going into detail, this structure comprises a first layer 400 that is transparent through all its thickness so as to let a light flux pass. By the term "transparent", what is meant is that the material forming the first layer is at least partially transparent to visible light.

The first layer 400 will for example be produced in the form of a single tile or of a plurality of juxtaposed tiles. It will for example be made from a transparent polymer, such as for example polymethyl methacrylate (PMMA) or polycarbonate.

The structure of the photovoltaic zone comprises an encapsulating assembly in which the photovoltaic cells are encapsulated. This encapsulating assembly preferably consists of two layers 402a, 402b of encapsulating material, between which the photovoltaic cells are encapsulated. A laminating operation is implemented in order to fuse the two encapsulating layers 402a, 402b into a single layer in which the photovoltaic cells Cp are embedded. The manufacturing process is detailed in the two aforementioned patent applications. Since said process does not form part of the invention, it is not described in detail in the present patent application.

By the employed term "encapsulating" or "encapsulated", what must be understood is that the photovoltaic cells Cp are housed in a preferably hermetic volume formed by joining the two layers of the assembly.

The structure of the photovoltaic zone comprises a second layer 403 forming its back face. The encapsulating assembly is positioned between the first layer 200 and this second layer 403. This second layer 403 will for example be made from a composite, for example a polymer/glass-fiber composite.

The structure of the photovoltaic zone advantageously comprises an intermediate layer 404, called the "damping" layer, which is located between the first layer 400 and the upper layer 402a of the encapsulating assembly (402a, 402b) and which allows the first layer 400 to be joined to the encapsulating assembly, notably by adhesive bonding.

The structure of the photovoltaic zone advantageously comprises an adhesive layer (not shown) located between the encapsulating assembly and the second layer 403. This layer will serve to join the second layer 403 to the encapsulating assembly, notably by adhesive bonding.

The first layer will advantageously be formed or covered with a tread so as to have an external surface with adherence properties that are sufficient and suitable both for the passage of pedestrians and for the passage of vehicles. It will for example be a question of giving the external surface a certain degree of roughness.

The photovoltaic cells Cp will advantageously be positioned on a layer of dark color (of black or blue color for example) so as to provide a sufficient contrast, through the transparent layer 400, with respect to the signaling zones.

With reference to FIG. 9, the signaling zones ZS each comprise lighting means, at least partially consisting of light-emitting diodes Ds present in each luminous signaling slab.

The light-emitting diodes Ds will possibly advantageously emit in different colors. Converting means will possibly advantageously be employed to emit in a hue close to white, corresponding to the color of the strips of a crosswalk. A given signaling zone ZS will possibly however emit light signals of a plurality of colors (either by employing light-emitting diodes with the desired colors or suitable converting means). By way of example, the lighting means of the signaling zones ZS will allow a luminance coefficient having a minimum value of 130 mcd/m$^2$/lx to be achieved.

Figure 11:
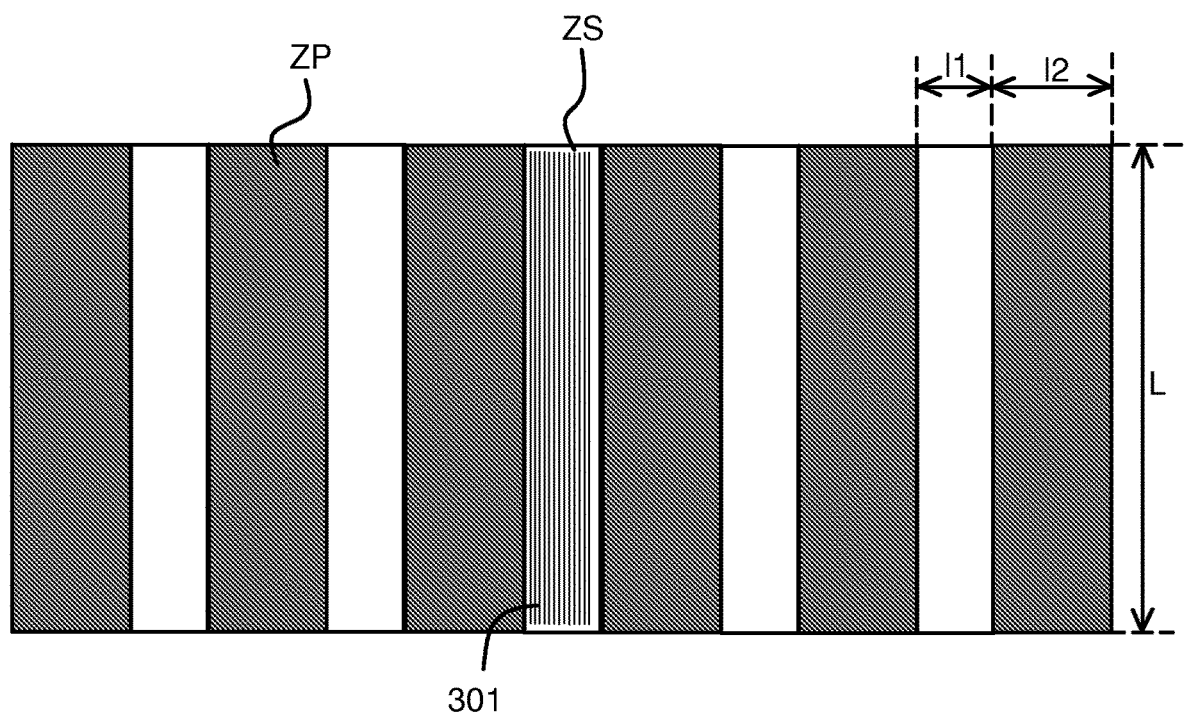
FIG. 11 illustrates an example of possible dimensions of a crosswalk system such as that of FIG. 7.

Nonlimitingly and with reference to FIG. 11, each signaling zone ZS has a similar structure to that of a photovoltaic zone, the light-emitting diodes Ds replacing the photovoltaic cells.

Nonlimitingly and more precisely, each signaling zone ZS is advantageously produced from one or more luminous signaling slabs such as described above with reference to FIGS. 1 to 4. Search luminous signaling slabs may thus be positioned adjacently and contiguously in order to form the external surface of the signaling zone ZS and to thus form each signaling strip of the crosswalk. All the technical features of the luminous signaling slabs described above with reference to FIGS. 1 to 4 are transposable, without modification, to use in the crosswalk system described with reference to FIGS. 7 to 9.

The employed light-emitting diodes Ds will advantageously be joined to a carrier taking the form of a ribbon (301—FIG. 8) or of an optimized printed circuit board. Nonlimitingly, each ribbon 301 for example takes the form of a printed circuit board made from a flexible or rigid material.

In the signaling zone ZS, the light-emitting diodes Ds are arranged to generate sufficient lighting to allow the zone to always be seen whatever the ambient light level. Nonlimitingly, a plurality of positional variants may be proposed:

- A first variant consists in placing the light-emitting diodes on the outline of the zone in order to delineate said outline. It will then for example be a question of placing ribbons 301 of diodes along the two lengths and the two widths of the zone. The interior of the zone, delineated by the light-emitting diodes, will remain in a white hue and without diode.
- A second variant consists in covering most of the signaling zone ZS. It will for example be a question of placing a plurality of ribbons in parallel (as in FIG. 9), each ribbon 301 being the width or the length of the strip formed by the signaling zone, so as to cover all the signaling zone ZS;
- A third variant for example consists in placing the light-emitting diodes so as to be able to display a particular message when they are turned on. It will then be a question of forming letters or a particular symbol by turning on the diodes of the ribbons 301;
- A fourth variant is suitable for elevated crosswalks. In this configuration, ribbons of light-emitting diodes are for example positioned on the outline of the signaling zones and notably on the inclined lateral portions allowing the elevation;

The crosswalk system also comprises a control and processing unit 15. This control and processing unit 15 is for example formed of a programmable logic controller comprising a central unit module UC and a plurality of input/output modules, below called inputs and outputs (referenced IN and OUT in FIG. 7) of the control and processing unit 15. The central unit module UC advantageously comprises a microprocessor and a memory. This control and processing unit 15 also comprises a power module ALIM that receives electrical power from the electrical energy storage unit. The control and processing unit 15 will possibly also comprise a communication module COM allowing the controller to connect to a (wired or wireless) communication network in order to gather any type of information, such as updates, statistics, etc. It will possibly also be a question of connecting a plurality of systems together, for example within a given town or city, via a communication network, in order to share information.

With reference to FIG. 9, the system also comprises a control system for controlling the lighting means of the signaling zones. This control system is advantageously made up of a plurality of drivers (16) that are each associated with one or more light-emitting diodes, and preferably with a least one ribbon of light-emitting diodes or with all the ribbons of a given signaling zone, in order to command them to turn on, to turn off and/or adjust their brightness, etc. The drivers 16 of the control system are advantageously integrated into the signaling zones ZS and are located as close as possible to the controlled light-emitting diodes. They are connected to one or more outputs (OUT) of the control and processing unit 15 in order to receive control signals (for example pulse-width modulated (PWM) control signals) suitable for the command sequence executed by the control and processing unit 15.

The system also comprises presence-detecting means that are connected to one or more inputs of the control and processing unit. These presence-detecting means are intended to detect the presence of one or more pedestrians about to cross the crosswalk.

With reference to FIG. 7, a plurality of variants (indicated by dashed lines in FIG. 7) of these presence-detecting means may be implemented, either alone or in combination:

- An infrared camera 17, for example positioned at the top of a pole and pointing in the direction of the crosswalk, in order to detect a presence. This solution has the advantage of working even in the case of low light levels. A camera will for example be placed on each sidewalk T1, T2 in the vicinity of the highway.
- A solution based on a photoelectric cell or on a plurality of photoelectric cells, which are for example arranged in the form of a light gate 18 generating a light beam (represented by a dashed line in FIG. 7) between an emitter and a receiver. This solution will ideally be placed on the edge of the highway, just upstream of the crosswalk. This solution will advantageously be integrated into the urban furniture, for example in the bollards conventionally positioned on the two opposite sidewalks T1, T2.
- A piezoelectric solution comprising one or more piezoelectric sensors 22 positioned under the signaling zones and/or under the photovoltaic zones. They will possibly also be integrated into the signaling zones, into the tactile paving slabs that are sometimes positioned in the vicinity of crosswalks, or into the photovoltaic zones, and for example be housed in the encapsulating assemblies encapsulating the photovoltaic cells or the light-emitting diodes.

In FIG. 7 it must of course be understood that certain detecting means are optional and that all thereof will not necessarily be employed in a given system.

Moreover, optionally, the system will also possibly comprise at least one manual control member 19 (and preferably two manual control members, located on the two opposite sidewalks T1, T2) connected to an input of the control and processing unit and intended to manually actuate the system, i.e. to activate the signaling zones ZS in a set command sequence (see below).

Optionally, the system will also possibly comprise means for detecting the arrival of a vehicle in proximity to the crossable zone, which means are connected to at least one input of the control and processing unit. These detecting means for example comprise an inductive measurement loop 20 formed on each lane of the highway, upstream of the crosswalk, thus allowing the direction of arrival of a vehicle to be indicated. Any other detecting means of this type could be envisioned, for example a laser measurement, allowing in addition the speed of the vehicle to be determined. Each loop will necessarily be positioned sufficiently upstream of the crosswalk to allow a pedestrian who is about to cross to receive the information satisfactorily. It will notably be a question of taking account of the speed limit applied around the crosswalk (for a speed limit of 30 km/h and with a view to ensuring a warning period of 5 s between the moment at which the automobile is detected and the moment at which it should reach the crosswalk, the detecting means will necessarily be positioned at a distance D of 41.50 meters with respect to the crosswalk).

Optionally, the system may also comprise a light sensor 21, intended to determine the light level in the vicinity of the crosswalk. Nonlimitingly, this sensor will for example be integrated into the crossable zone of the crosswalk, positioned in the electrical cabinet that contains the electrical apparatuses for managing the system, or into the pole that bears the infrared camera.

These various options will advantageously be powered with the electrical energy stored in the electrical energy storage unit 14. However, it must also be understood that all the aforementioned sensors will possibly also be self-powered, for example incorporating an energy generator of any type (piezoelectric, photovoltaic, electromagnetic, thermal, etc.). Moreover, certain of the sensors will advantageously be wireless. The link with the control and processing unit 15 will then be achieved via a wireless communication network, for example a Zigbee network in order to limit the energy consumption of the sensor.

When the control and processing unit 15 receives a signal on one or more of its inputs, it activates the lighting of the signaling zones of the system by sending suitable control signals to the control system for controlling the light-emitting diodes Ds.

According to one particular aspect of the system, the control and processing unit 15 implements a command sequence to command the signaling zones.

Depending on which of the various detection solutions described above are present, various command sequences will possibly be envisioned. It will be noted that the control and processing unit 15 will possibly advantageously store, in its memory, a plurality of distinct sequences, the choice of the sequence to be executed depending on the data made available on its inputs, and/or on information received on its inputs from the various sensors.

Figure 12A:
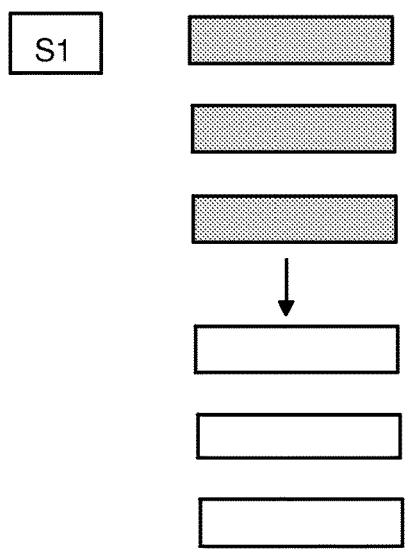
FIGS. 12A to 12C illustrate various command sequences implemented in the improved crosswalk system of FIG. 7.
Figure 12B:
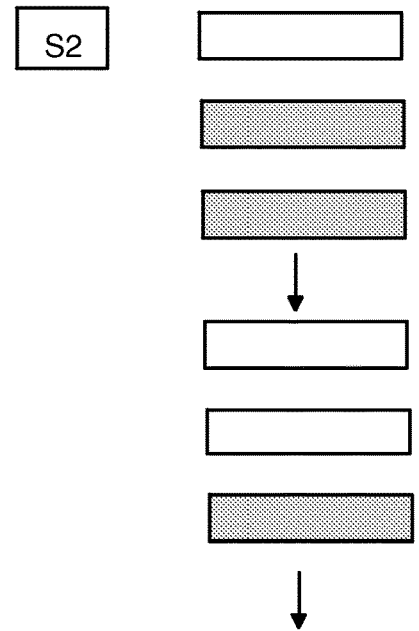
Figure 12C:
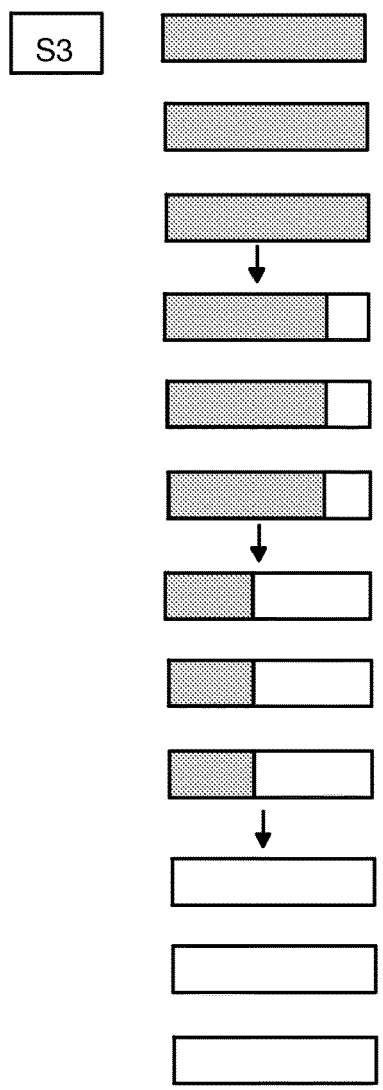

FIGS. 12A to 12C show certain possible command sequences. In these figures, the color gray indicates that the signaling zones are turned off and the color white indicates that these zones are turned on. The command sequence executed by the control and processing unit will thus possibly command the signaling zones ZS to turn on in the various following modes, which may be implemented alone or in combination:

- Each signaling zone is commanded to turn on instantaneously—Sequence S1, FIG. 12A;
- Each signaling zone is commanded to turn on gradually;
- All the signaling zones are commanded to turn on at the same time—Sequence S1, FIG. 12A;
- The zones are commanded to turn on one after another, for example taking account of the advance of the pedestrian (either via a pre-recorded delay depending on the average speed of a pedestrian, or taking account of information received by piezoelectric sensors positioned in the zones or taking account of any other information obtained by any other means)—Sequence S2, FIG. 12B,
- The signaling zones are commanded to turn on variably throughout the day or on each crossing, in order to take account of variations in light level; and
- The signaling zones are commanded to turn on variably, certain light-emitting diodes of a signaling zone or a plurality of signaling zones being activated. It will for example be a question of maintaining a minimum brightness when light levels are low and of gradually increasing the number of light-emitting diodes activated in order to take account of the increasing light level in order to ensure the signaling zones always remain clearly visible;
- The diodes are commanded to turn on so as to display a particular message, for example related to the imminent arrival of a vehicle;
- The diodes are commanded to turn on in a targeted way, for example in a gradual way depending on the direction of arrival of the vehicle on the crosswalk, which is detected by virtue of the sensors 20. In case of danger, it will for example be a question of commanding light of red color—Sequence S3, FIG. 12C, Example Embodiment and Dimensions Nonlimitingly, with reference to FIG. 11, the system of the invention comprising an alternation of photovoltaic zones and of signaling zones for example has the following characteristics:

Five signaling zones ZS and six photovoltaic zones ZP;
Front-face lighting density without diffuser:
  One signaling zone ZS: width l1 0.5 m×length L 2.8 m;
  Ribbons 301 of aligned light-emitting diodes, cut to the desired length (density of thirty light-emitting diodes Ds per meter of ribbon) and laid out in the direction of the length of the zone, the ribbons being spaced apart by a constant pitch of 3.3 cm in the direction of the width of the zone;
  Thirteen ribbons 301 of 2.5 m length per signaling zone ZS;
Lighting power:
  Manufacturing datum: 2.4 W/m
  Power of a signaling zone at maximum brightness: 2.4×2.6×13=81 W/zone
  Namely a total power of: 5×81=405 W for all of the five signaling zones;
Available photovoltaic power:
  Six photovoltaic zones of width l2 0.7 m×length L 2.8 m
  Photovoltaic power: 240 Wp/zone 4 Total Power: 1440 Wp
Dimensions of the battery (electrical energy storage unit 14):
  1 h/day at 100%→500 Wh/day
  Sought-after self-sufficiency without sunlight: 3 days→1500 Wh under 12V→125 Ah
  Installed batteries: 2 times 90 Ah i.e. 180 Ah i.e. a little more than four days of self-sufficiency.

It will be understood from the above that this crosswalk system has a certain number of advantages, among which:

- An easy installation, the photovoltaic zones and the signaling zones advantageously taking the form of slabs to be juxtaposed;
- Self-sufficiency in terms of electrical energy, permitted by the use of the photovoltaic zone;
- Different solutions with respect to the animation of the signaling zones, which allow account to be taken of various operating conditions and various situations;
- A non-negligible saving in bulk, the signaling zones and the photovoltaic zones intended to supply them with power being produced directly in the crossable zone;

The invention claimed is:

1. An apparatus comprising a slab, wherein said slab is a luminous signaling slab, wherein said slab is of integral construction and comprises a structure having superposed layers that are fastened to one another, wherein said structure comprises a first layer, a luminous assembly, and encapsulating assembly, and a second layer, wherein said first layer forms a front face of said slab, wherein said first layer is transparent or translucent, wherein said luminous assembly comprises light-emitting diodes that are electrically connected to one another, wherein said encapsulating assembly encapsulates said light-emitting diodes, wherein said second layer forms a back face of said slab, wherein said second layer comprises at least one of a polymer and a composite of polymer and glass fiber, and wherein said encapsulating assembly is positioned between said first layer and said second layer.

2. The apparatus of claim 1, wherein said first layer of said slab comprises tiles, wherein each tile faces at least one light-emitting diode.

3. The apparatus of claim 1, wherein the first layer of said slab comprises a polymer selected from the group consisting of polycarbonate, polymethyl methacrylate, ethylene tetrafluoroethylene and polyvinylidene fluoride.

4. The apparatus of claim 1, wherein said first layer has a thickness in excess of a hundred micrometers.

5. The apparatus of claim 1, wherein the second layer of said slab has a stiffness defined by a Young's modulus, wherein, at room temperature, said stiffness is higher than a gigapascal.

6. The apparatus of claim 1, wherein said second layer of said slab has a thickness that is between 0.3 millimeters and 3 millimeters.

7. The apparatus of claim 1, wherein said light-emitting diodes are organized in a ribbon, wherein said ribbon is deposited on said second layer, on a carrier or connected to a printed circuit board.

8. The apparatus of claim 1, wherein said second layer comprises a printed circuit board to which said light-emitting diodes are directly connected.

9. The apparatus of claim 1, wherein the encapsulating assembly is made from a material having a Young's modulus, wherein, at room temperature, said modulus is in excess of fifty megapascals.

10. The apparatus of claim 1, wherein said encapsulating assembly has a thickness that is between a hundred micrometers and four millimeters.

11. The apparatus of claim 1, wherein the structure comprises at least one intermediate layer, arranged between said first layer and the encapsulating assembly and configured to join said first layer to the encapsulating assembly by adhesive bonding.

12. The apparatus of claim 11, wherein said intermediate layer is made from one or more materials selected from the group consisting of polyolefin, rubber, elastomer, and epoxy.

13. The apparatus of claim 12, wherein the intermediate layer is configured to have a Young's modulus at room temperature lower than or equal to 100 MPa.

14. The apparatus of claim 12, wherein said intermediate layer has a thickness that is between 200 micrometers and 1600 micrometers.

15. The apparatus of claim 1, wherein said structure comprises an adhesive layer located on said back face, wherein said adhesive layer contacts said second layer.

16. The apparatus of claim 1, wherein said structure comprises a tread applied to said first layer, wherein said tread is non-opaque and wherein said tread has a textured and irregular surface.

17. The apparatus of claim 1, further comprising a crossable zone equipped with a base layer, wherein said slab is fastened to said base layer, wherein said slab is positioned so as to form at least part of a marking on said crossable zone when said luminous assembly is turned on.

18. The apparatus of claim 1, wherein said first layer has a thickness that is between 200 micrometers and 3200 micrometers.

19. The apparatus of claim 1, wherein said first layer has a thickness that is between 400 micrometers and 750 micrometers.

20. The apparatus of claim 1, wherein said encapsulating assembly has a thickness that is between two hundred and fifty micrometers and a millimeter.

* * * * *